(12) United States Patent
Luo et al.

(10) Patent No.: US 8,017,469 B2
(45) Date of Patent: Sep. 13, 2011

(54) DUAL HIGH-K OXIDES WITH SIGE CHANNEL

(75) Inventors: Tien-Ying Luo, Beacon, NY (US);
Gauri V. Karve, Fishkill, NY (US);
Daniel G. Tekleab, Wappingers Falls, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 183 days.

(21) Appl. No.: 12/357,057

(22) Filed: Jan. 21, 2009

(65) Prior Publication Data

US 2010/0184260 A1 Jul. 22, 2010

(51) Int. Cl.
*H01L 21/8238* (2006.01)
(52) U.S. Cl. .. 438/216; 438/274; 438/785; 257/E21.639
(58) Field of Classification Search ................... 438/216, 438/785, 981, 274, 591; 257/E21.639
See application file for complete search history.

(56) References Cited

U.S. PATENT DOCUMENTS

| | | | |
|---|---|---|---|
| 6,787,421 | B2 | 9/2004 | Gilmer et al. |
| 2004/0032001 | A1 | 2/2004 | Gilmer et al. |
| 2004/0173815 | A1 | 9/2004 | Yeo et al. |
| 2005/0136584 | A1 | 6/2005 | Boyanov et al. |
| 2007/0272952 | A1 | 11/2007 | Thean et al. |
| 2008/0128822 | A1* | 6/2008 | Koyama et al. ............... 257/369 |

OTHER PUBLICATIONS

G. Karve et al., U.S. Appl. No. 11/851,719, filed Sep. 7, 2007, entitled Dual Gate Oxide Device Integration.
G. Karve et al., U.S. Appl. No. 11/931,565, filed Oct. 31, 2007, entitled Semiconductor Devices with Different Dielectric Thicknesses.
International Search Report and Written Opinion for Application No. PCT/US2010-020849, mailed Jul. 29, 2010.

* cited by examiner

*Primary Examiner* — Matthew Reames
(74) *Attorney, Agent, or Firm* — Hamilton & Terrile, LLP; Michael Rocco Cannatti

(57) ABSTRACT

A method and apparatus are described for integrating dual gate oxide (DGO) transistor devices (50, 52) and core transistor devices (51, 53) on a single substrate (15) having a silicon germanium channel layer (21) in the PMOS device areas (112, 113), where each DGO transistor device (50, 52) includes a metal gate (25), an upper gate oxide region (60, 84) formed from a second, relatively higher high-k metal oxide layer (24), and a lower gate oxide region (58, 84) formed from a first relatively lower high-k layer (22), and where each core transistor device (51, 53) includes a metal gate (25) and a core gate dielectric layer (72, 98) formed from only the second, relatively higher high-k metal oxide layer (24).

25 Claims, 3 Drawing Sheets

DUAL HIGH-K OXIDES WITH SIGE CHANNEL

BACKGROUND OF THE INVENTION

1. Field of the Invention

The present invention is directed in general to the field of semiconductor devices. In one aspect, the present invention relates to the fabrication of metal gate electrodes used in semiconductor devices.

2. Description of the Related Art

As semiconductor devices are scaled, aspects of device design and fabrication that previously gave rise to only second-order effects in long-channel devices can no longer be ignored. For example, the scaling of channel length and gate oxide thickness in a conventional MOS transistor exacerbates problems of polysilicon gate depletion, high gate resistance, high gate tunneling leakage current and dopant (i.e., boron) penetration into the channel region of the device. As a result, CMOS technology is increasingly replacing silicon dioxide gate dielectrics and polysilicon gate conductors with high dielectric constant (high-k) dielectrics in combination with metal gate electrodes formed from a gate stack of polysilicon and one or more metal layers. With such technologies, the metal gate layers not only obviate gate-depletion and boron-penetration effects, but also provide a significantly lower sheet resistance.

While high-k dielectrics in conjunction with metal gate electrodes advantageously exhibit improved transistor performance, the use of new metal layer technologies can create new technical challenges. For example, when the threshold voltage for metal gate PMOS devices is adjusted by including a silicon germanium layer in the PMOS channel region, the existing dual gate oxide (DGO) fabrication processes may not be compatible if they use thermal oxidation or high temperature thermal oxidation process to form the thick gate oxide over the silicon germanium layer. This is because the high temperature process causes the germanium to diffuse into the regions of the substrate or the gate oxide that should not contain any germanium, thereby degrading the profile of the silicon germanium channel. Thermal oxidation of a silicon germanium channel layer can also create high interface state density that can adversely affect core and DGO device performance by creating a serious Time-Dependent Dielectric Breakdown (TDDB) issue.

Accordingly, a need exists for an improved metal gate electrode and manufacture method for an improved dual gate oxide device integration which incorporates one or more high-k gate dielectric materials to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
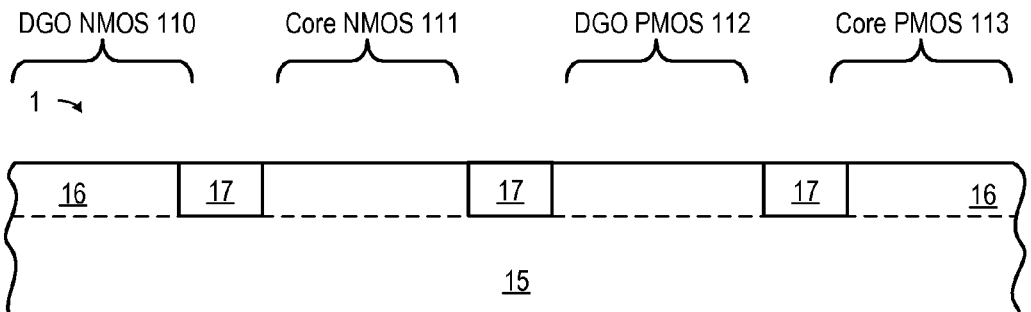
FIG. 1 is a partial cross-sectional view of a semiconductor wafer structure including a semiconductor layer.

A method and apparatus are described for integrating dual gate oxide (DGO) transistor devices and core transistor devices on a single substrate where each transistor includes a metal gate and one or more high-k gate dielectric layers. As disclosed, a thicker gate dielectric is formed to include a first, relatively lower high-k layer and a second, relatively higher high-k metal oxide layer in a region of the device for higher voltage requirements (e.g., an I/O region), and a thinner second gate dielectric is formed with the second, relatively higher high-k metal oxide layer in a region of the device for lower voltage requirements (e.g., a core device region). The substrate may be formed to include a channel layer in one or both of the PMOS and NMOS devices areas, where the channel layer is formed from a semiconductor material having a different electrical property than the underlying semiconductor substrate (e.g., a SiC channel layer in the NMOS device area or a SiGe channel layer in the PMOS device area). When the PMOS devices are formed on a SiGe channel layer, the threshold voltage of PMOS metal-gate devices can be adjusted independently of NMOS devices. The DGO transistor devices may be fabricated to include a first, relatively lower high-k layer (e.g., Hafnium silicate or $HfSiO_xN_y$) and a second, relatively higher high-k metal oxide layer (e.g., Hafnium oxide), while the core transistor devices may be fabricated using the second, relatively higher high-k metal oxide layer as the core gate dielectric layer. Finally, a single metal layer and polysilicon layer are sequentially formed or deposited over the DGO and core device areas, and then selectively etched to form PMOS and NMOS gate electrodes having tuned the threshold voltages and improved gate oxide integrity.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, it is noted that, throughout this detailed description, certain layers of materials will be deposited and removed to form the depicted semiconductor structures. Where the specific procedures for depositing or removing such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention. In addition, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention.

Referring now to FIG. 1, there is shown a partial cross-sectional view of a semiconductor wafer structure 1. The structure 1 includes a semiconductor layer 16 formed on or as part of a semiconductor substrate 15 that has a first crystallographic orientation. Also illustrated is a plurality of shallow trench isolations 17 that divide the layer 16 into separate regions, such as an NMOS dual gate oxide (N-DGO) region 110, an NMOS core (N-Core) region 111, a PMOS dual gate oxide (P-DGO) region 112, and a PMOS core (P-Core) region 113. Although not shown, the materials of layer 16 for NMOS device areas 110, 111 and PMOS device areas 112, 113 may be different. For example, the N-DGO region 110 and N-Core region 111 may be implanted with boron to form P-well regions, and the P-DGO region 112 and PMOS core region 113 may be implanted with arsenic or phosphorus to form N-well regions (not shown). NMOS devices may be formed in N-DGO region 110 and N-Core region 111. PMOS devices may be formed in P-DGO region 112 and P-Core region 113. The devices formed in the dual gate oxide regions (110 and 112) will be formed with thicker gate oxide and the devices formed in the core regions (111 and 113) will be formed with thinner gate oxide.

Depending on the type of transistor device being fabricated, the semiconductor layer 15, 16 may be implemented as a bulk silicon substrate, single crystalline silicon (doped or undoped), semiconductor on insulator (SOI) substrate, or any semiconductor material including, for example, Si, SiC, SiGe, SiGeC, Ge, GaAs, InAs, InP, as well as other III/V or II/VI compound semiconductors or any combination thereof, and may optionally be formed as the bulk handling wafer. The semiconductor layer 15, 16 has a channel crystallographic orientation of <100>. The present disclosure will also work for devices with other crystal orientation such as <110>, <111> which may be desirable for enhancing carrier mobility. For any FET type (NMOS or PMOS), the layer 16 may consist of multiple stacks of materials. Of note is that although bulk type of substrate is shown here for the description of the invention, the invention is not limited to any specific substrate type. For example, the starting substrate for the invention can be of semiconductor-on-insulator (SOI) type having a buried insulator layer under a top layer of semiconductor, or a dual substrate orientation substrate, such as partial bulk and partial SOI with orientation different for bulk and SOI.

The isolation regions or structures 17 are formed to electrically isolate the NMOS device areas 110, 111 from the PMOS device areas 112, 113. Isolation structures 17 define lateral boundaries of an active region or transistor region 110-113 in active layer 16, and may be formed using any desired technique, such as selectively etching an opening in the second semiconductor layer 16 using a patterned mask or photoresist layer (not shown), depositing a dielectric layer (e.g., oxide) to fill the opening, and then polishing the deposited dielectric layer until planarized with the remaining second semiconductor layer 16. Any remaining unetched portions of the patterned mask or photoresist layer(s) are stripped. As will be appreciated, the isolation regions or structures 17 may be formed in other ways in other embodiments.

Figure 2:
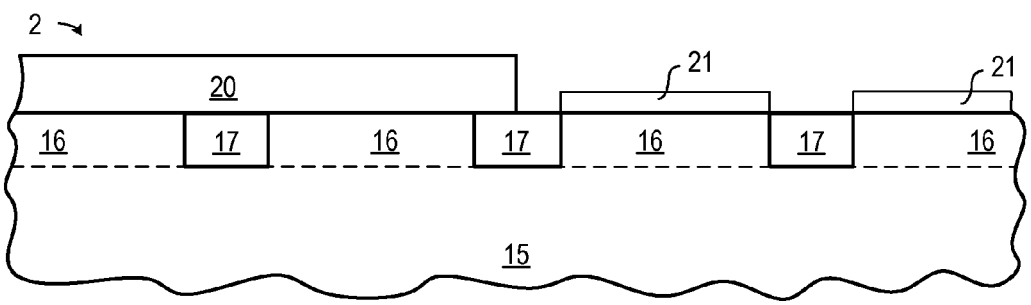
FIG. 2 illustrates processing subsequent to FIG. 1 where a masking layer is formed over NMOS areas of the semiconductor wafer structure and an epitaxial SiGe layer is selectively formed over PMOS areas of the semiconductor wafer structure.

FIG. 2 illustrates processing of a semiconductor wafer structure 2 subsequent to FIG. 1 where a patterned masking layer 20 is selectively formed over NMOS areas 110, 111 of the semiconductor wafer structure and an epitaxial SiGe layer 21 is selectively formed over PMOS areas 112, 113 of the semiconductor wafer structure. For example, one or more masking layers 20 (e.g., an oxide layer and/or nitride layer) may be deposited and/or grown over the semiconductor wafer structure, and then conventional patterning and etching techniques may be used to form an opening in the mask layer(s) 20 that exposes at least the PMOS device area 112, 113. The selectively formed masking layer 20 is used to define and differentiate active regions for NMOS and PMOS devices subsequently formed on the wafer structure 16. After forming the patterned masking layer 20, a thin, compressively stressed semiconductor layer 21 is selectively formed over the PMOS area(s) 112, 113 of the semiconductor wafer structure that will be used to form the PMOS devices. Though the semiconductor layer 21 is shown in the figures as being formed on top of the semiconductor layer 16, it will be appreciated that the semiconductor layer 21 may be embedded in the semiconductor layer 16. In selected embodiments, the thin, compressively stressed semiconductor layer 21 is formed with a semiconductor material having larger atom-to-atom spacing than the underlying second semiconductor layer 16, such as SiGe, SiGeC, or combinations and composition by weight thereof, which is capable of being formed utilizing a selective epitaxial growth method or other deposition methods accompanied by subsequent re-crystallization. For example, if PMOS devices are formed over the semiconductor layer 16 in the PMOS area 112, 113 and the semiconductor material for layer 16 is silicon, the semiconductor layer 21 may be formed by epitaxially growing a SiGe layer that is thinner than a critical relaxation thickness to form a compressive SiGe layer 21. This epitaxial growth may be achieved by a process of chemical vapor deposition (CVD) at a chamber temperature between 400 and 900° C. in the presence of dichlorosilane, germane ($GeH_4$), HCl, and hydrogen gas. So long as the thickness of the SiGe layer 21 is less than the critical relaxation thickness, the SiGe layer 21 is compressively stressed. As will be appreciated, the critical relaxation thickness for a SiGe layer will depend on the amount of germanium contained in the layer 21 and the layer thickness. In an example embodiment, an epitaxially grown SiGe layer 21 that has 10% to 50% germanium (e.g., 20% to 35% germanium) and that is grown to a predetermined thickness in a range of at least 30 Angstroms to 150 Angstroms (e.g., approximately 100 Angstroms) will have a biaxial compressive strain because of the lattice mismatch between layers 22 and 16. Compressive stress and lower band gap of SiGe allows for threshold voltage lowering and mobility enhancement for PMOS devices in regions 112 and 113. In addition, SiGe can be doped with Boron for further reduction of PMOS threshold voltage. Although a channel layer 21 of silicon germanium may be formed, it will be appreciated that other semiconductor materials having different electrical properties from semiconductor substrate 16 may be used. For example, in one embodiment, silicon carbide may be used, or any semiconductor material may be used that changes a band gap of a channel region for NMOS devices. In another embodiment, any semiconductor material that changes a band gap of a channel region of a thick gate device relative to a channel region of a thin gate device may be used. Though not shown, it will be appreciated that a semiconductor cap layer may be formed over the epitaxial semiconductor layer 21 by epitaxially growing or depositing a layer of silicon to a predetermined thickness of approximately 15 Angstroms over the underlying SiGe layer 22, though other thicknesses and materials may be used.

Figure 3:
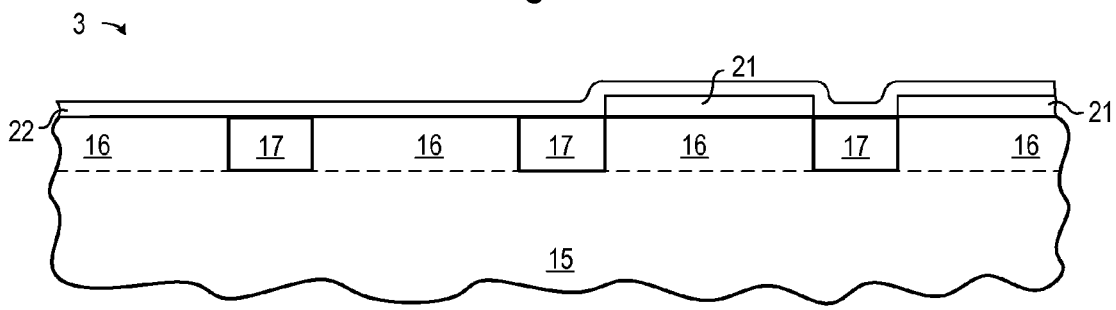
FIG. 3 illustrates processing subsequent to FIG. 2 after the masking layer is removed and a first high-k gate dielectric layer is disposed over the semiconductor wafer structure.

FIG. 3 illustrates processing of a semiconductor wafer structure 3 subsequent to FIG. 2 after the mask layer 20 is removed, and a first high-k gate dielectric layer 22 is disposed over the semiconductor wafer structure. In selected embodiments, the first high-k gate dielectric layer 22 is formed by depositing a high-k gate dielectric material with a relatively low dielectric constant value on top of the DGO device areas and the core device areas 110-113 using chemical vapor deposition (CVD), plasma-enhanced chemical vapor deposition (PECVD), physical vapor deposition (PVD), atomic layer deposition (ALD), or any combination(s) of the above. In selected embodiments, the first high-k gate dielectric layer 22 may be formed by a low temperature CVD or ALD process to a predetermined final thickness in the range of 1-100 Angstroms (e.g., 10-50 Angstroms, or more particularly, 20-30 Angstroms), though other thicknesses may be used. A suitable high-k gate dielectric material for the gate dielectric layer 22 is an insulator material having a dielectric constant value k of 7.0 or greater that is lower than the dielectric constant value of the second high-k gate dielectric layer 24 (described below). A suitable temperature for the deposition process is in the range of approximately 200 degrees Celsius to approximately 400 degrees Celsius, and is controlled to reduce or eliminate the diffusion of germanium. A suitable high-k gate dielectric material for use as the first high-k gate dielectric layer 22 is a hafnium-based dielectric which does not adversely interact with the underlying silicon germanium layer 21, such as hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_x$, $ZrSiO_x$, $LaSiO_x$, $YSiO_x$, $ScSiO_x$, $CeSiO_x$, and $HfLaSiO_x$. In addition, multi-metallic oxides (for example barium strontium titanate, BST) may also provide high-k dielectric properties. As will be appreciated, the first high-k gate dielectric layer 22 may be formed in other ways in other embodiments.

Figure 4:
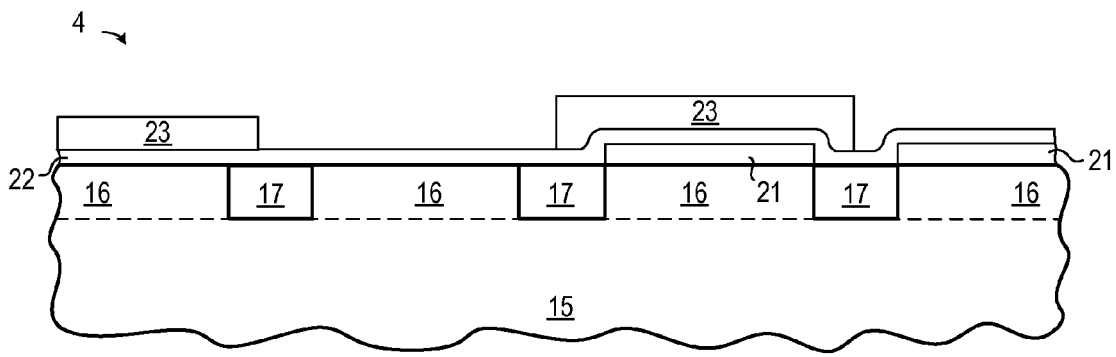
FIG. 4 illustrates processing subsequent to FIG. 3 after a patterned etch mask is formed on the first high-k gate dielectric layer in the DGO device areas.

FIG. 4 illustrates processing of a semiconductor wafer structure 4 subsequent to FIG. 3 after a patterned etch mask 23 is formed on the first high-k gate dielectric layer 22 in the DGO device areas 110, 112. The patterned etch mask 23 may be formed by applying a layer of photoresist that is patterned directly on the first high-k gate dielectric layer 22 to mask the DGO device areas 110, 112, or a multi-layer masking technique may be used to form a etch mask pattern 23 over the first high-k gate dielectric layer 22 in the DGO device areas 110, 112.

Figure 5:
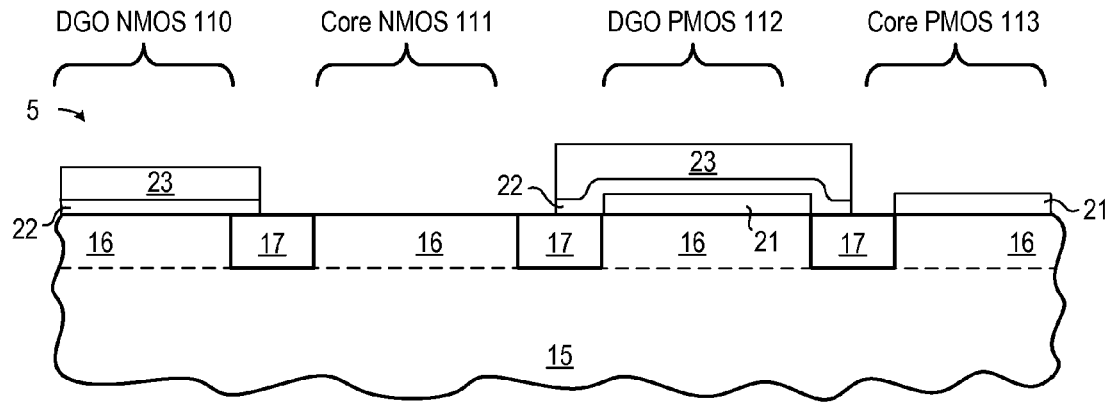
FIG. 5 illustrates processing subsequent to FIG. 4 after exposed portions of the first high-k gate dielectric layer are removed from the core device areas.

FIG. 5 illustrates processing of a semiconductor wafer structure 5 subsequent to FIG. 4 after exposed portions of the first high-k gate dielectric layer 22 are removed from the core device areas 111, 113. In particular, with the patterned resist or mask layer 23 in place, the exposed portions of the first high-k gate dielectric layer 22 are selectively etched and removed from the core device areas 111, 113, thereby leaving portions of the first high-k gate dielectric layer 22 in the DGO device areas 110, 112. The pattern transfer and etching of the mask layer 23 may use one or more etching steps to remove the unprotected portions of the layer 22, including a dry etching process such as reactive-ion etching, ion beam etching, plasma etching or laser etching, a wet etching process wherein a chemical etchant is employed or any combination thereof. For example, the exposed portion of first high-k gate dielectric layer 22 may be anisotropically etched using a reactive ion etch process, leaving the lower gate oxide region 22 in N-DGO region 110 and in the P-DGO region 112. In other embodiments, the exposed portions of the first high-k gate dielectric layer 22 may be removed from N-Core region 111 and P-Core region 113 using a hydrofluoric acid (HF) clean, such as a diluted HF clean process.

After the mask etch process, the patterned photoresist layer 23 is removed. This is shown in FIG. 6 which illustrates processing of a semiconductor wafer structure 6 subsequent to FIG. 5 after the patterned etch mask 23 is stripped or removed, such as by using, for example, a piranha clean or solvent clean process.

Figure 6:
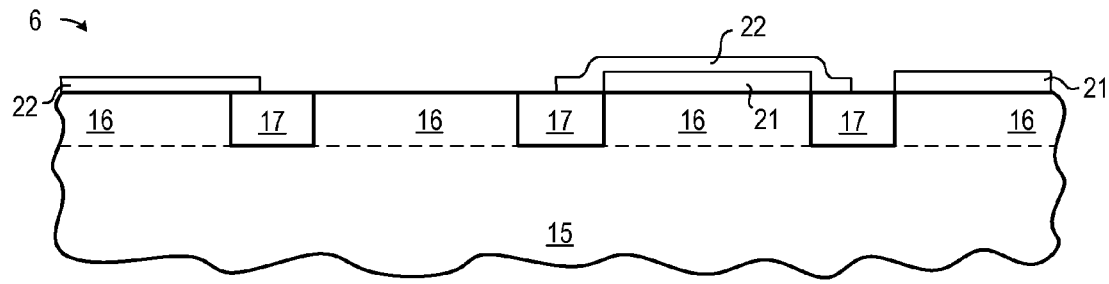
FIG. 6 illustrates processing subsequent to FIG. 5 after the patterned etch mask is stripped or removed.
Figure 7:
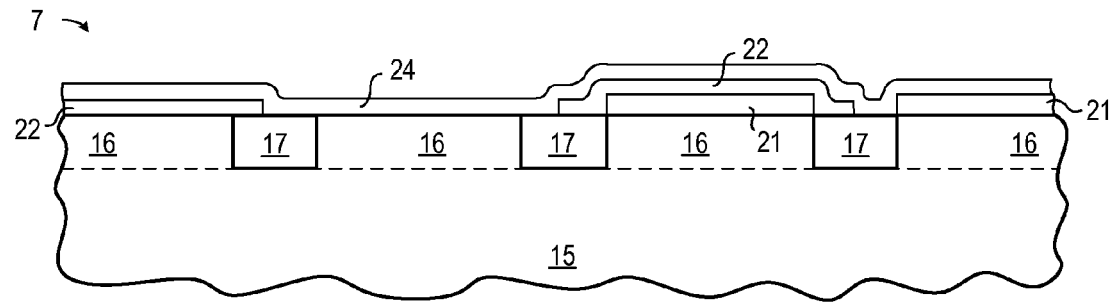
FIG. 7 illustrates processing subsequent to FIG. 6 after a second high-k gate dielectric layer is disposed over the semiconductor wafer structure.

FIG. 7 illustrates processing of a semiconductor wafer structure 7 subsequent to FIG. 6 after a second high-k gate dielectric layer 24 is disposed over the semiconductor wafer structure. Prior to forming the second high-k gate dielectric layer 24, a pre-cleaning process (e.g., an RCA standard clean 1 or 2 solution without HF) may be applied to clear the top surfaces of the relevant regions. As illustrated, the second high-k gate dielectric layer 24 is formed by depositing a high-k gate dielectric material with a relatively high dielectric constant value on top of the DGO device areas and the core device areas 110-113 so that the dielectric layer 24 directly overlies the lower gate oxide region 22 in the N-DGO region 110, a portion of the semiconductor layer 16 in N-Core region 111, the lower gate oxide region 22 in the P-DGO region 112, and the SiGe layer 21 in the P-Core region 113. In selected embodiments, the second high-k gate dielectric layer 24 is deposited using CVD, PECVD, PVD, ALD, or any combination(s) of the above to a predetermined final thickness in the range of 1-100 Angstroms (e.g., 10-50 Angstroms, or more particularly, 15-20 Angstroms), though other thicknesses may be used. A suitable high-k gate dielectric material for the gate dielectric layer 24 is an insulator material having a dielectric constant value k greater than 7.0 that is higher than the dielectric constant value of the first high-k gate dielectric layer 22. For example, a metal oxide compound may be used that does not include silicon (e.g., $HfO_2$), though other oxides, silicates or aluminates of zirconium, aluminum, lanthanum, strontium, tantalum, titanium and combinations thereof may also be used, including but not limited to $Ta_2O_5$, $ZrO_2$, $TiO_2$, $Al_2O_3$, $Y_2O_3$, $La_2O_3$, $HfSiN_yO_x$, $ZrSiN_yO_x$, $ZrHfO_x$, $LaSiO_x$, $YSiO_x$, $ScSiO_x$, $CeSiO_x$, $HfLaSiO_x$, $HfAlO_x$, $ZrAlO_x$, and $LaAlO_x$. In addition, multi-metallic oxides (for example barium strontium titanate, BST) may also provide high-k dielectric properties. As will be appreciated, the second high-k gate dielectric layer 24 may be formed in other ways in other embodiments.

Figure 8:
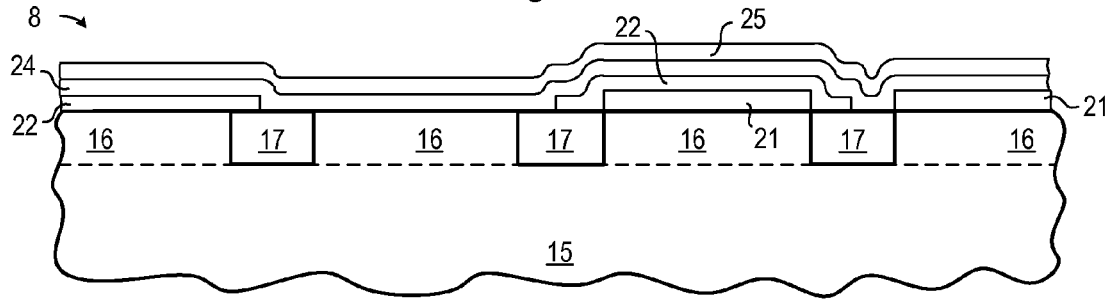
FIG. 8 illustrates processing subsequent to FIG. 7 after a first metal-based gate layer is deposited over the semiconductor wafer structure.

Next, as shown in FIG. 8 which illustrates processing of a semiconductor wafer structure 8 subsequent to FIG. 7, a first metal-based gate layer 25 is deposited on the second high-k gate dielectric layer 24. In selected embodiments, the metal-based layer 25 is deposited on the second high-k gate dielectric layer 24 using any desired deposition or sputtering process, such as CVD, PECVD, PVD, ALD, molecular beam deposition (MBD) or any combination(s) thereof A suitable material for use as the metal-based layer 25 is an element or alloy (e.g., TaC or W) which may be deposited over the NMOS and PMOS regions 110-113 to a predetermined thickness of 20-150 Angstroms (e.g., 50-100 Angstroms), though other metallic layer materials with different thicknesses may be used. In selected embodiments, the metal-based layer 25 may include an element selected from the group consisting of Ti, Ta, La, Ir, Mo, Ru, W, Os, Nb, Ti, V, Ni, W, and Re to form a metal or metal-based layer that may contain carbon and/or nitrogen (such as TiN, TaC, HfC, TaSi, ZrC, Hf, etc.) or even a conductive metal oxide (such as $IrO_2$).

Figure 9:
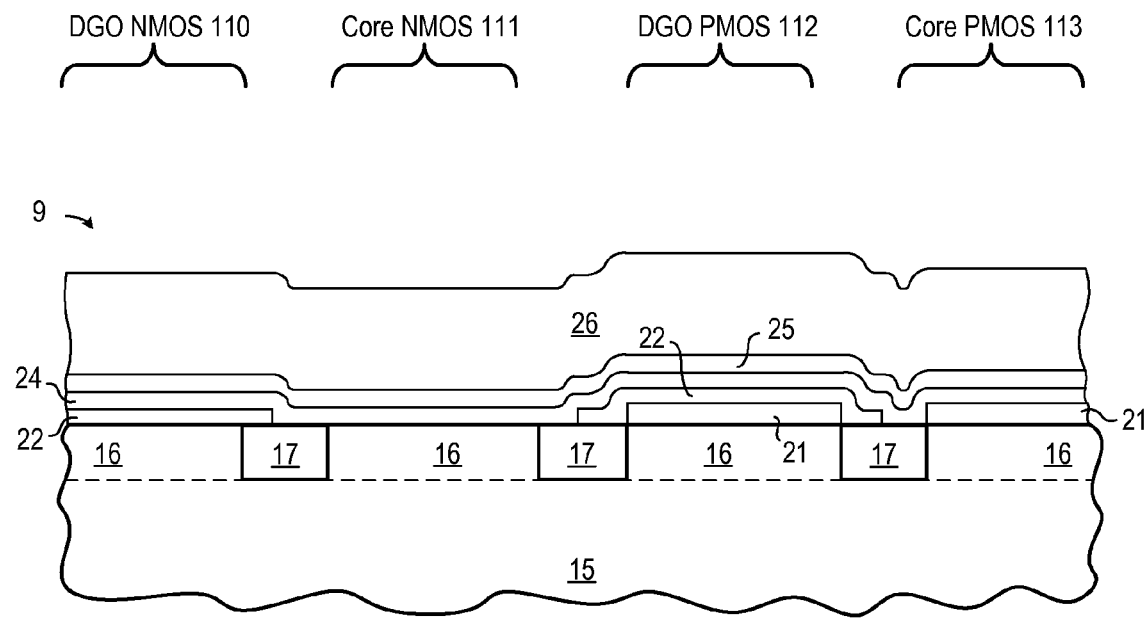
FIG. 9 illustrates processing subsequent to FIG. 8 after a silicon-containing gate layer is disposed over the first metal-based layer.

FIG. 9 illustrates processing of a semiconductor wafer structure 9 subsequent to FIG. 8 after a silicon-containing gate layer 26 is disposed over the metal-based layer 25 to form a metal gate stack. In selected embodiments, the silicon-containing layer 26 is an amorphous or polysilicon cap layer or an amorphous/poly silicon germanium cap layer that is formed using CVD, PECVD, PVD, ALD, MBD, or any combination(s) thereof to a predetermined thickness in the range of 200-1000 Angstroms (e.g., 500-600 Angstroms), though other materials and thicknesses may be used. Silicon-containing layer 26 may also be a doped or undoped amorphous silicon or silicon germanium layer. An anti-reflective coating (ARC) (not shown) may subsequently be formed over silicon-containing gate layer 26 to a thickness in the range of approximately 10 to 200 Angstroms, though other thicknesses may be used. In a selected embodiment, ARC layer is formed by depositing a silicon-rich silicon nitride layer, an organic ARC, a silicon-oxy nitride, or any ARC material which serves an ARC function for the particular lithography process. As will be appreciated, ARC layer may be applied directly to the silicon-containing layer 26 or as part of a multilayer mask on the silicon-containing layer 26. As deposited, the amorphous silicon-containing layer 26 covers the NMOS and PMOS device area 110-113.

Figure 10:
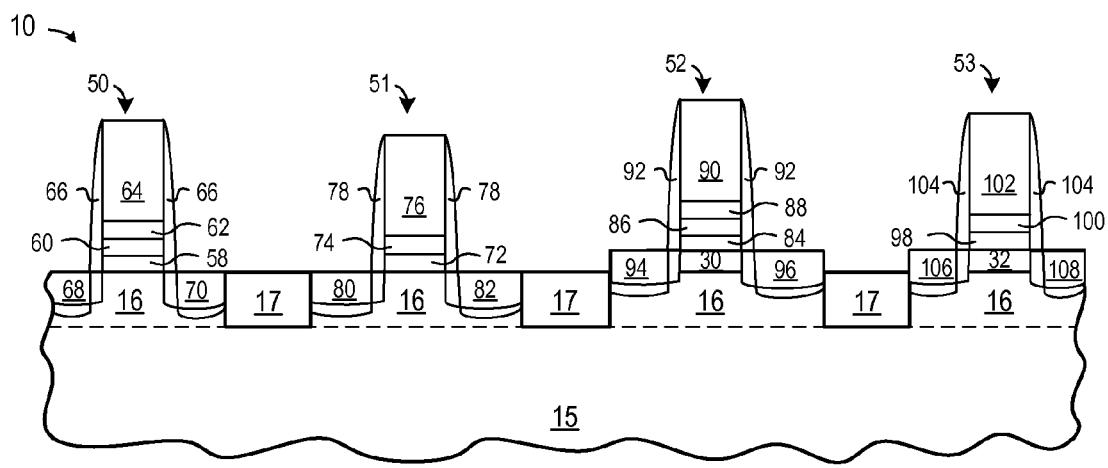
FIG. 10 illustrates processing subsequent to FIG. 9 after the single metal gate stack is selectively etched to form gate electrodes and the NMOS and PMOS core and DGO devices are at least partially completed.

FIG. 10 illustrates processing of a semiconductor wafer structure 10 subsequent to FIG. 9 after PMOS and NMOS devices 50-53 are formed. As a preliminary step, the metal gate stack is selectively etched to form NMOS and PMOS gate electrodes in the core and DGO device regions 110-113 using any desired pattern and etching processes, including application and patterning of photoresist directly on the ARC layer, though multi-layer masking techniques may also be used. By way of example, N-DGO device 50 may be formed in N-DGO region 110, N-Core device 51 may be formed in N-Core region 111, P-DGO device 52 may be formed in P-DGO region 112, and P-Core device 53 may be formed in P-Core region 113. These devices may be formed by forming gate electrodes, spacers, and source/drain regions using conventional semiconductor processing steps. Thus, for example, N-DGO device 50 may include a gate structure including a lower gate oxide region 58 (formed from the first relatively lower high-k layer 22), an upper gate oxide region 60 (formed from the second relatively higher high-k layer 24), a metal gate electrode region 62, and a polysilicon gate electrode region 64. N-DGO device 50 may further include spacers 66 formed adjacent to the gate structure. N-DGO device 50 may further include source/drain regions 68 and 70 that are implanted at least in part around the gate structure and/or spacers 66. N-Core device 51 may include a gate structure including a gate oxide region 72 (formed from the second relatively higher high-k layer 24), a metal gate electrode region 74, and a polysilicon gate electrode region 76. N-Core device 52 may further include spacers 78 formed adjacent to the gate structure, and source/drain regions 80 and 82 that are implanted at least in part around the gate structure and/or spacers 78. P-DGO device 52 may include silicon germanium region 30. P-DGO device 52 may further include a gate structure including a lower gate oxide region 84 (formed from the first relatively lower high-k layer 22), an upper gate oxide region 86 (formed from the second relatively higher high-k layer 24), a metal gate electrode region 88, and a polysilicon gate electrode region 90. P-DGO device 52 may further include spacers 92 formed adjacent to the gate structure and source/drain regions 94 and 96 that are implanted at least in part around the gate structure and/or spacers 92. P-Core device 53 may include silicon germanium region 32. P-Core device 53 may further include a gate structure including a gate oxide region 98 (formed from the second relatively higher high-k layer 24), a metal gate electrode region 100, and a polysilicon gate electrode region 102. P-Core device 53 may further include spacers 104 formed adjacent to the gate structure and source/drain regions 106 and 108 that are implanted at least in part around the gate structure and/or spacers 104.

As described herein, the inclusion of the lower gate oxide regions 58, 84 in the DGO NMOS and PMOS devices 50, 52 improves the interface quality with the upper gate oxide regions 60, 84 because of the material similarity between the first high-k gate dielectric layer 22 (e.g., $HfSiO_x$) and the second high-k gate dielectric layer 24 (e.g., $HfO_2$). In addition, by forming the lower gate oxide regions 58, 84 from a first high-k gate dielectric layer 22 having a relatively lower k (e.g., $HfSiO_x$), the physical thickness increase required to meet desired electrical oxide thickness (Tox) is minimized, thus ensuring better film quality. Finally, the formation of the lower gate oxide regions 58, 84 with a relatively low temperature deposition of the first high-k gate dielectric layer 22 reduces the germanium diffusion from the silicon germanium channel layer which leads to high interface state density and TDDB problems, as compared to forming a gate dielectric layer with a high temperature thermal oxide process. In addition, the formation of the gate oxide regions 72, 98 with the second relatively higher high-k layer 24 provides improved core device performance for the N-Core devices 51 and P-Core devices 53.

As will be appreciated, additional or different processing steps may be used to complete the fabrication of the depicted device structures 50-53 into functioning devices. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact plugs and multiple levels of interconnect(s) that are used to connect the device components in a desired manner to achieve the desired functionality. Once the wafer fabrication process is completed, the wafer can be singulated or diced into separate integrated circuits dies for subsequent electrical connection, such as by leadframe attachment, wirebonding and encapsulation. Thus, the specific sequence of steps used to complete the fabrication of the device components may vary, depending on the process and/or design requirements.

By now, it should be appreciated that there has been provided herein a semiconductor fabrication process for integrating DGO and core transistors on a single substrate. In the disclosed methodology, a wafer is provided that includes a first semiconductor layer as a semiconductor-on-insulator (SOI) substrate structure or bulk substrate structure with PMOS and NMOS device areas which include a DGO NMOS device area, an NMOS core device area, a DGO PMOS device area and a PMOS core device area. On at least part of the first semiconductor layer, a compressive silicon germanium layer is formed, such as by epitaxially growing silicon germanium to a predetermined thickness. On the compressive silicon germanium layer for P-DGO and Silicon for N-DGO, a deposited first high-k dielectric layer is selectively formed from a first dielectric material (e.g., a silicate or metal oxy-nitride material, such as $Hf_xSi_{1-x}O_y$ or $Hf_xSi_{1-x}O_yN_z$) which has a first dielectric constant value greater than 7.0. The selective formation of the first high-k dielectric layer may include blanket depositing the first high-k dielectric layer over the NMOS device area and the PMOS device area (including the compressive silicon germanium layer in the PMOS device area), followed by forming a patterned etch mask to cover the compressive silicon germanium layer and then selectively etching the first high-k dielectric layer to expose the NMOS device area while leaving the first high-k dielectric layer over the compressive silicon germanium layer. In selected embodiments, a low temperature deposition process is used to deposit the silicate or metal oxy-nitride material where the temperature is selected to reduce or eliminate germanium diffusion from the compressive silicon germanium layer. Subsequently, a second high-k dielectric layer is deposited over the PMOS and NMOS device areas, where the second high-k dielectric layer is formed from a second dielectric material which has a dielectric constant value that is higher than the first dielectric constant value. For example, the second high-k dielectric layer may be a layer of $HfO_2$ that is deposited over the first high-k dielectric layer in the PMOS device area and over the first semiconductor layer in the NMOS device area. The process further includes depositing one or more gate electrode layers over the second high-k dielectric layer.

In another form, there is provided a method of forming devices. In the disclosed methodology, a first gate dielectric device is formed in a first (DGO) region of a semiconductor substrate, where a compressive silicon germanium layer or silicon carbide layer may be epitaxially grown on a first channel region. In forming the first gate dielectric device, a first gate dielectric formed is formed by depositing a first high-k dielectric layer (e.g., $Hf_xSi_{1-x}O_y$ or $Hf_xSi_{1-x}O_yN_z$) and a second high-k dielectric layer (e.g., $HfO_2$) over the silicon germanium layer in the first channel region of the semiconductor substrate, where the first high-k dielectric layer has a first dielectric constant value that is smaller than a second dielectric constant value for the second high-k dielectric layer. In selected embodiments, the first high-k dielectric layer is deposited as a silicate or metal oxy-nitride material in a deposition process which occurs at a temperature that is selected to reduce or eliminate germanium diffusion from the compressive silicon germanium layer. In addition, a gate electrode material is deposited over the second high-k dielectric layer. The disclosed methodology also forms a second gate dielectric device in a second (core) region of the semiconductor substrate by forming a second gate dielectric that is thinner than the first gate dielectric and that is formed by depositing the second high-k dielectric layer (e.g., $HfO_2$) over a second channel region of the semiconductor substrate. In addition, a gate electrode material is deposited over the second high-k dielectric layer. Finally, the disclosed methodology may also form a third gate dielectric device in a third (DGO) region of the semiconductor substrate that includes a third gate dielectric formed by sequentially depositing the first and second high-k dielectric layers over a third channel region of the semiconductor substrate. In addition, a fourth gate dielectric device may be formed in a fourth (core) region of the semiconductor substrate that includes a fourth gate dielectric that is thinner than the third gate dielectric and that is formed by depositing the second high-k dielectric layer over a fourth channel region of the semiconductor substrate.

In yet another form, there is provided a method for forming a semiconductor device on a semiconductor substrate having first and second device areas (e.g., DGO and core device areas). As disclosed, a compressive silicon germanium layer may be epitaxially grown on one or more PMOS channel regions of the semiconductor substrate (e.g., in the first and/or second device areas). Subsequently, a first high-k dielectric layer having a first dielectric constant value of 7.0 or greater is formed over the first device area, such as by depositing a layer of $Hf_xSi_{1-x}O_y$ or $Hf_xSi_{1-x}O_yN_z$ on the silicon germanium layer with a deposition process which occurs at a temperature that is selected to reduce or eliminate germanium diffusion from the compressive silicon germanium layer. To form the first high-k dielectric layer in the first area, the first high-k dielectric layer may be deposited as a layer of silicate or metal oxy-nitride over the first and second device areas, and then selectively etched from the second device area to expose the semiconductor substrate in the second device area. In addition, a second high-k dielectric layer (e.g., $HfO_2$) is formed over the first high-k dielectric layer in the first device area and over the semiconductor substrate in the second device area, where the second high-k dielectric layer has a dielectric constant value that is higher than the first dielectric constant value. One or more gate electrode layers are then over the second high-k dielectric layer and selectively etched to form one or more gate electrode structures over the first and second device areas. By forming the first high-k dielectric layer over the first device area with a relatively lower dielectric constant value, there is a reduction in the thickness measure for the first high-k dielectric layer in the first device area that is required to meet a predetermined electrical oxide thickness (Tox) requirement as compared to forming the first high-k dielectric layer with a material having a higher dielectric constant value.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. For example, although the process flow is described above with respect to PMOS devices having silicon germanium regions, a similar process flow may be used with NMOS devices having silicon carbon. In the NMOS device process flow, the semiconductor layer 21 could be formed as a silicon carbide layer to change a band gap of an NMOS channel region, in which case the DGO device 52 would be formed as an N-DGO device, and the core device 53 would be formed as an N-Core device. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the invention is not limited to any particular type of integrated circuit described herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor fabrication process comprising:
    providing a wafer comprising a first semiconductor layer having a PMOS device area and an NMOS device area;
    forming a compressive silicon germanium layer on at least the PMOS device area;
    selectively forming a deposited first high-k dielectric layer over the compressive silicon germanium layer, where the first high-k dielectric layer is formed from a first dielectric material which has a first dielectric constant value of 7.0 or greater;
    depositing a second high-k dielectric layer over the first high-k dielectric layer in the PMOS device area and over the first semiconductor layer in the NMOS device area, where the second high-k dielectric layer is formed from a second dielectric material which has a dielectric constant value that is higher than the first dielectric constant value; and
    depositing one or more gate electrode layers over the second high-k dielectric layer.

2. The semiconductor fabrication process of claim 1, where providing the wafer comprises providing a first semiconductor layer as a semiconductor-on-insulator (SOI) substrate structure or bulk substrate structure.

3. The semiconductor fabrication process of claim 1, where forming the compressive silicon germanium layer comprises epitaxially growing silicon germanium to a predetermined thickness.

4. The semiconductor fabrication process of claim 1, where selectively forming the deposited first high-k dielectric layer comprises depositing a silicate or metal oxy-nitride material.

5. The semiconductor fabrication process of claim 1, where selectively forming the deposited first high-k dielectric layer comprises depositing a layer of $Hf_xSi_{1-x}O_y$ or $Hf_xSi_{1-x}O_yN_z$ over at least the compressive silicon germanium layer.

6. The semiconductor fabrication process of claim 1, where selectively forming the deposited first high-k dielectric layer comprises depositing a silicate or metal oxy-nitride material in a deposition process which occurs at a temperature that is selected to reduce or eliminate germanium diffusion from the compressive silicon germanium layer.

7. The semiconductor fabrication process of claim 1, where selectively forming the deposited first high-k dielectric layer comprises:
    blanket depositing the first high-k dielectric layer over the PMOS device area and the NMOS device area;
    forming a patterned etch mask to cover the compressive silicon germanium layer in the first PMOS device area; and
    selectively etching the first high-k dielectric layer to expose the NMOS device area while leaving the first high-k dielectric layer over the compressive silicon germanium layer.

8. The semiconductor fabrication process of claim 1, where depositing the second high-k dielectric layer comprises depositing a layer of $HfO_2$ over the first high-k dielectric layer in the PMOS device area and over the first semiconductor layer in the NMOS device area.

9. A method of forming devices comprising:
    forming a first gate dielectric device in a first region of a semiconductor substrate, wherein the first gate dielectric device comprises a first gate dielectric formed by depositing a first high-k dielectric layer and a second high-k dielectric layer over a first channel region of the semiconductor substrate, where the first high-k dielectric layer has a first dielectric constant value that is smaller than a second dielectric constant value for the second high-k dielectric layer; and
    forming a second gate dielectric device in a second region of the semiconductor substrate, wherein the second gate dielectric device comprises a second gate dielectric that is thinner than the first gate dielectric and that is formed by depositing the second high-k dielectric layer over a second channel region of the semiconductor substrate.

10. The method of claim 9, where forming the first gate dielectric device and the second gate dielectric device further comprises depositing a gate electrode material over the second high-k dielectric layer.

11. The method of claim 9, further comprising epitaxially growing a compressive silicon germanium layer on the first channel region of the semiconductor substrate prior to depositing the first high-k dielectric layer.

12. The method of claim 11, where forming the first gate dielectric device comprises:
    depositing a first high-k dielectric layer of $Hf_xSi_{1-x}O_y$ or $Hf_xSi_{1-x}O_yN_z$ over the compressive silicon germanium layer; and
    depositing a second high-k dielectric layer of $HfO_2$ over the first high-k dielectric layer.

13. The method of claim 12, where forming the second gate dielectric device comprises depositing the second high-k dielectric layer of $HfO_2$ over the second channel region.

14. The method of claim 11, where forming the first gate dielectric device comprises depositing the first high-k dielectric layer as a silicate or metal oxy-nitride material in a deposition process which occurs at a temperature that is selected to reduce or eliminate germanium diffusion from the compressive silicon germanium layer.

15. The method of claim 9, further comprising epitaxially growing a silicon carbide layer on the first channel region of the semiconductor substrate prior to depositing the first high-k dielectric layer.

16. The method of claim 9, further comprising:
    forming a third gate dielectric device in a third region of the semiconductor substrate, wherein the third gate dielectric device comprises a third gate dielectric formed by depositing the first high-k dielectric layer and the second high-k dielectric layer over a third channel region of the semiconductor substrate; and
    forming a fourth gate dielectric device in a fourth region of the semiconductor substrate, wherein the fourth gate dielectric device comprises a fourth gate dielectric that is thinner than the third gate dielectric and that is formed by depositing the second high-k dielectric layer over a fourth channel region of the semiconductor substrate.

17. A method for forming a semiconductor device comprising:
provinding a semiconductor substrate comprising first and second device areas;
forming a first high-k dielectric layer over the first device area, where the first high-k dielectric layer has a first dielectric constant value of 7.0 or greater;
forming a second high-k dielectric layer over the first high-k dielectric layer in the first device area and over the semiconductor substrate in the second device area, where the second high-k dielectric layer has a dielectric constant value that is higher than the first dielectric constant value;
forming one or more gate electrode layers over the second high-k dielectric layer; and
selectively etching the one or more gate electrode layers to form one or more gate electrode structures over the first and second device areas.

18. The method of claim 17, further comprising epitaxially growing a compressive silicon germanium layer on one or more PMOS channel regions of the semiconductor substrate in the first and second device areas prior to forming the first high-k dielectric layer.

19. The method of claim 18, where forming the first high-k dielectric layer comprises depositing a layer of $Hf_xSi_{1-x}O_y$ or $Hf_xSi_{1-x}O_yN_z$ over at least the compressive silicon germanium layer in a deposition process which occurs at a temperature that is selected to reduce or eliminate germanium diffusion from the compressive silicon germanium layer.

20. The method of claim 17, where forming the first high-k dielectric layer comprises:
depositing the first high-k dielectric layer as a layer of silicate or metal oxy-nitride over the first and second device areas; and
selectively etching the first high-k dielectric layer from the second device area to expose the semiconductor substrate in the second device area.

21. The method of claim 17, where forming the second high-k dielectric layer comprises depositing a layer of $HfO_2$ over the first high-k dielectric layer in the first device area and over the semiconductor substrate in the second device area.

22. The method of claim 17, where forming the first high-k dielectric layer over the first device area reduces a thickness measure for the first high-k dielectric layer in the first device area that is required to meet a predetermined electrical oxide thickness (Tox) requirement as compared to forming the first high-k dielectric layer with a material having a higher dielectric constant value.

23. A semiconductor fabrication process comprising:
selectively forming a first high-k dielectric layer in a PMOS region of a semiconductor substrate, where the first high-k dielectric layer is formed from a first dielectric material which has a first high-k dielectric constant value; and
forming a second high-k dielectric layer over the first high-k dielectric layer in the PMOS region and over an NMOS region of the semiconductor substrate, where the second high-k dielectric layer is formed from a second dielectric material which has a high-k dielectric constant value that is higher than the first high-k dielectric constant value.

24. The semiconductor fabrication process of claim 23, further comprising depositing one or more gate electrode layers over the second high-k dielectric layer.

25. The semiconductor fabrication process of claim 24, further comprising selectively etching the one or more gate electrode layers to form one or more gate electrode structures over the PMOS and NMOS regions.

* * * * *